(12) United States Patent  
Kawakami

(10) Patent No.: US 9,224,872 B2  
(45) Date of Patent: Dec. 29, 2015

(54) NON-VOLATILE MEMORY CIRCUIT

(71) Applicant: SEIKO INSTRUMENTS INC., Chiba (JP)

(72) Inventor: Ayako Kawakami, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 0 days.

(21) Appl. No.: 14/097,296

(22) Filed: Dec. 5, 2013

(65) Prior Publication Data

US 2014/0159133 A1 Jun. 12, 2014

(30) Foreign Application Priority Data

Dec. 10, 2012 (JP) .................................. 2012-269760

(51) Int. Cl.
*H01L 29/788* (2006.01)
*H01L 29/423* (2006.01)

(52) U.S. Cl.
CPC ...... *H01L 29/7885* (2013.01); *H01L 29/42324* (2013.01)

(58) Field of Classification Search
CPC ............ H01L 27/115; H01L 27/11517; H01L 27/1156; H01L 29/42324; H01L 29/788
USPC .......... 257/239, 261, 314–317, 368, E21.209, 257/E21.662, E21.679, E29.129, E29.3, 257/E21.422, E21.685
See application file for complete search history.

(56) References Cited

U.S. PATENT DOCUMENTS

| 5,181,090 | A  | * | 1/1993  | Maruo ........................... 257/344 |
| 2004/0021160 | A1 | * | 2/2004  | Eguchi et al. .................. 257/296 |
| 2006/0197150 | A1 | * | 9/2006  | Ueda et al. ..................... 257/340 |
| 2006/0238241 | A1 | * | 10/2006 | Pearce et al. .................... 330/10 |
| 2007/0215949 | A1 | * | 9/2007  | Kijima ........................... 257/355 |
| 2007/0296046 | A1 | * | 12/2007 | Ohdaira et al. ................ 257/401 |
| 2008/0001238 | A1 | * | 1/2008  | Kanda et al. ................... 257/413 |
| 2009/0175085 | A1 | * | 7/2009  | Tsumura ................... 365/185.18 |
| 2011/0062516 | A1 | * | 3/2011  | Kato ............................. 257/336 |
| 2012/0256251 | A1 | * | 10/2012 | Kitajima ....................... 257/328 |
| 2012/0261750 | A1 | * | 10/2012 | Yamashina et al. ........... 257/335 |

FOREIGN PATENT DOCUMENTS

JP 2001257324 9/2001

* cited by examiner

*Primary Examiner* — Kyoung Lee
*Assistant Examiner* — Joannie A Garcia
(74) *Attorney, Agent, or Firm* — Adams & Wilks

(57) ABSTRACT

A non-volatile memory circuit includes a non-volatile memory having a first source and drain region having a non-LOCOS offset structure and a second source and drain region having a LOCOS offset structure. A pair of switch circuits are connected in parallel to the respective first and second source and drain regions for switching voltages applied to the first and second source and drain regions so that the first source and drain region serves as a drain and the second source and drain region serves as a source in a writing mode, the second source and drain region serves as a drain and the first source and drain region serves as a source in a reading mode, and equal voltages are applied to the first source and drain region and the second source and drain region in a retention mode.

6 Claims, 5 Drawing Sheets

| Input | Write | Read | Retention |
|---|---|---|---|
| SW1 | High | Low | High |
| SW2 | Low | High | High |
| V1 | Vss | Vdd | Vss |
| V2 | Vdd | Vss | Vss |

NON-VOLATILE MEMORY CIRCUIT

BACKGROUND OF THE INVENTION

1. Field of the Invention

The present invention relates to a non-volatile memory circuit capable of electrical writing and reading.

2. Description of the Related Art

There is known a semiconductor integrated circuit including a bleeder resistor circuit capable of trimming a resistance value by a memory instead of a fuse. Hitherto, the bleeder resistance is adjusted by a method of mechanically cutting the fuse formed in parallel to the bleeder resistor with use of laser light or the like. The trimming of the bleeder resistor can accordingly be performed only before assembling a package. The use of a memory for trimming the bleeder resistor, on the other hand, enables electrical trimming even after the assembly. The following two typical benefits are obtained.

1. Customers' requests for quick delivery can be accommodated because the trimming is carried out for the bleeder resistor in the package and any further processing is unnecessary before shipment.

2. High precision can be achieved because the trimming covers package-related shift, which is electrical characteristics fluctuation that occurs due to stress in assembling the package.

In general, once the bleeder resistor is trimmed, there is no need to rewrite thereafter information represented by stored electrical charges. As a trimming memory, a one-time programmable (OTP) memory using an ultraviolet erasable, non-volatile erasable programmable read only memory (EPROM) can accordingly be used.

As a related-art ultraviolet erasable non-volatile EPROM, a non-volatile EPROM designed to write electric charges as information with use of hot carriers is known. The structure of the related-art non-volatile EPROM designed to write information with the use of hot carriers is exemplified with reference to FIG. 4.

A P-type well 16 is formed along one principal surface of a P-type semiconductor substrate 15 in which an element isolation region 17 is selectively formed. In the P-type well 16, impurities having N-type conductivity are heavily diffused to form a source region 18 and a drain region 19. On the semiconductor substrate in which the source region 18 and the drain region 19 are formed, a floating gate 21 is formed through intermediation of a gate oxide film 20. On the floating gate 21, a control gate 23 is formed through intermediation of a second insulating film 22. The related-art non-volatile EPROM is configured in this way. The structure of electrode wiring and other members to be formed in subsequent processes (metal wiring and protective film) is the same as that in a commonly used semiconductor device, and hence its detailed description is omitted.

Next, a description is given of an operation method of the related-art non-volatile EPROM.

In writing data, a voltage is applied between the source and the drain and to the control gate so as to generate hot carriers. Then, hot electrons as hot carriers are injected into the floating gate, to thereby shift a threshold voltage. Each state before and after the threshold voltage shift is associated with "0" or "1" of digital information.

In reading data, a potential is applied between the source and the drain, and the magnitude of a current corresponding to the threshold that differs depending on the presence or absence of writing is monitored, to thereby make a determination of "0" or "1".

In the related-art non-volatile EPROM, however, because the potential is applied between the source and the drain and the current flows in reading data, electrons move between the source and the drain so that a part of the electrons in slight amount become hot carriers to be injected into the floating gate, resulting in causing a threshold shift. Accordingly, if the reading operation is repeated, the problem of erroneous writing in which data is rewritten occurs. It is thus required for the related-art non-volatile EPROM to reduce the threshold shift due to erroneous writing.

In Japanese Published Patent Application No. 2001-257324, the following method is employed to reduce the threshold shift due to erroneous writing. FIG. 5 illustrates a schematic diagram of the invention described in Japanese Published Patent Application No. 2001-257324. A semiconductor integrated circuit of Japanese Published Patent Application No. 2001-257324 includes non-volatile memories (PM1 and PM2 of FIG. 5) having different threshold voltages and two read transistors (DM1 and DM2 of FIG. 5) having gate voltages corresponding to respective voltage of the floating gates of the two non-volatile memories and being capable of taking a state depending on the quantity of electric charges stored in the respective non-volatile memories. The two read transistors can prevent the current flow through the non-volatile memories in read mode, thereby preventing the threshold shift due to erroneous writing.

In the method described in Japanese Published Patent Application No. 2001-257324, however, although the threshold shift due to erroneous writing may be prevented, the two non-volatile semiconductor memories having different thresholds as well as the two read transistors are necessary for each memory cell. As a result, the area of the memory cell becomes larger to be disadvantageous also in terms of cost.

SUMMARY OF THE INVENTION

It is therefore an object of the present invention to provide a semiconductor non-volatile memory circuit capable of preventing erroneous writing without sacrificing write characteristics.

In order to achieve the above-mentioned object, the present invention uses the following measures.

A non-volatile memory transistor having a one-sided LOCOS offset structure is used as a non-volatile memory element, and two pairs of switch transistors connected in parallel to the non-volatile memory element are controlled so that the non-LOCOS offset side serves as a drain in writing and the LOCOS offset side serves as the drain in reading. In a steady state (a state in which power supply is turned on, but the writing or reading is not performed), no potential is applied between the source and the drain of the non-volatile memory element.

With the above-mentioned method, in a writing mode, hot carriers generated in the vicinity of the drain end are more likely to be injected because the drain side has the non-LOCOS offset structure, thereby obtaining write characteristics equivalent to those of a related-art memory transistor without a LOCOS offset structure. On the other hand, in a reading mode, the electric field in the vicinity of the drain end is relaxed so that hot carriers responsible for the threshold shift are less likely to be generated because the drain has the LOCOS offset structure, thereby being capable of reducing the threshold shift due to erroneous writing. In a retention mode, erroneous writing can be prevented because no potential is applied between the source and the drain of the non-volatile memory element. Consequently, the non-volatile memory circuit capable of preventing erroneous writing while maintaining write efficiency can be provided.

According to one embodiment of the present invention, the non-volatile memory transistor having the one-sided LOCOS offset structure is used as the non-volatile memory element, and the two pairs of switch transistors connected in parallel to the non-volatile memory element are controlled. As a result, the non-LOCOS offset side serves as the drain in writing to maintain the write characteristics equivalent to those of the related-art non-LOCOS offset non-volatile memory element. Besides, the LOCOS offset side serves as the drain in reading and no potential is applied between the source and the drain of the non-volatile memory element in the steady state (a state in which power supply is turned on, but the writing or reading is not performed) to prevent erroneous writing. Consequently, the non-volatile memory circuit capable of preventing erroneous writing while maintaining write efficiency can be provided.

DETAILED DESCRIPTION OF THE PREFERRED EMBODIMENTS

Embodiments of the present invention are described in detail below.

Figure 1:
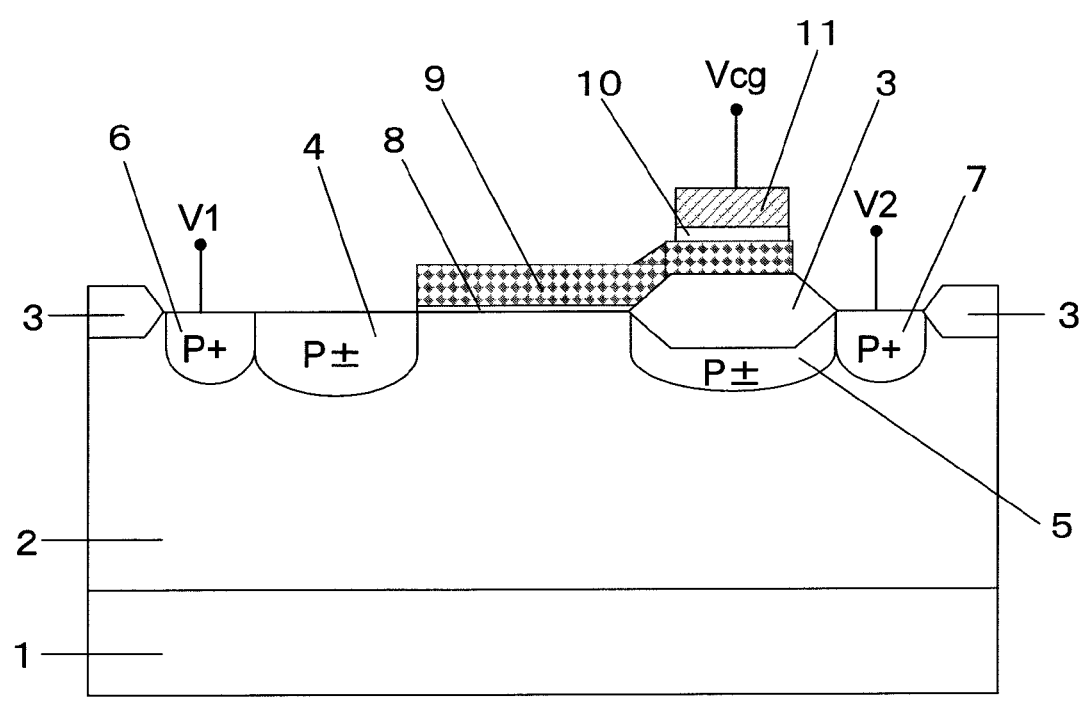
FIG. 1 is a cross-sectional view illustrating the structure of a non-volatile memory used in an embodiment of the present invention.

FIG. 1 is a cross-sectional view illustrating the structure of a non-volatile memory element according to the present invention. An N-type well 2 is formed along one principal surface of a P-type semiconductor substrate 1 in which a LOCOS oxide film 3 similarly to that used in an element isolation region is selectively formed. On a part of the surface of the semiconductor substrate 1 in which the N-type well 2 is formed, a floating gate 9 is formed through intermediation of a gate oxide film 8 and the LOCOS oxide film 3. An end portion of the gate oxide film 8 is in contact with one end of the LOCOS oxide film 3. One end of the floating gate 9 is located on the semiconductor substrate 1 through the intermediation of the gate oxide film 8, but the other end of the floating gate 9 is located on the semiconductor substrate 1 through intermediation of the LOCOS oxide film 3.

In the surface of the semiconductor substrate 1 at the one end of the floating gate 9, a first lightly doped region 4 in which P-type impurities are diffused is formed, and further a first source and drain region 6 in which P-type impurities are heavily diffused is formed to be in contact with the side of the first lightly doped region 4 opposite to the floating gate 9. In this way, an offset structure is obtained. The first source and drain region 6 has a non-LOCOS offset structure in which a gate oxide film located below the floating gate 9 in proximity to the first source and drain region 6 has a uniform thickness to realize an offset structure that does not include a thick LOCOS oxide film.

On the other hand, on a lower surface of the LOCOS oxide film 3 located below the other end of the floating gate 9, a second lightly doped region 5 in which P-type impurities are diffused is formed, and a second source and drain region 7 in which P-type impurities are heavily diffused is formed to be in contact with the other ends of the second lightly doped region 5 and the LOCOS oxide film 3. In this way, an offset structure is similarly obtained. However, the second source and drain region 7 has a LOCOS offset structure because a part of the gate oxide film located below the floating gate 9 is formed of the LOCOS oxide film 3. A capacitive coupling oxide film 10 is formed on a part of the floating gate 9 located on the LOCOS oxide film 3, and a control gate 11 capacitively coupled with the part of the floating gate 9 is formed through intermediation of the capacitive coupling oxide film 10.

Electrode wiring for applying a predetermined potential is formed through contacts on the substrate surface in which the first source and drain region 6 is formed, on the substrate surface in which the second source and drain region 7 is formed, and on the control gate 11, thereby configuring a P-channel non-volatile memory used in this embodiment. The structure of metal wiring, a protective film, and other members after the formation of the contacts is the same as that in a commonly used semiconductor device, and hence its detailed description is omitted.

The largest feature of the non-volatile memory used in this embodiment resides in the one-sided LOCOS offset structure. Although the P-channel non-volatile memory formed in the N-type well region on the P-type substrate is exemplified in this embodiment, similar effects can be obtained even by an N-channel non-volatile memory. Further, although the non-LOCOS offset side has the offset structure set by a mask in this embodiment, similar effects can be obtained even by a conventional structure, a lightly doped drain (LDD) structure, or a double diffused drain (DDD) structure.

Figures 2, 3:
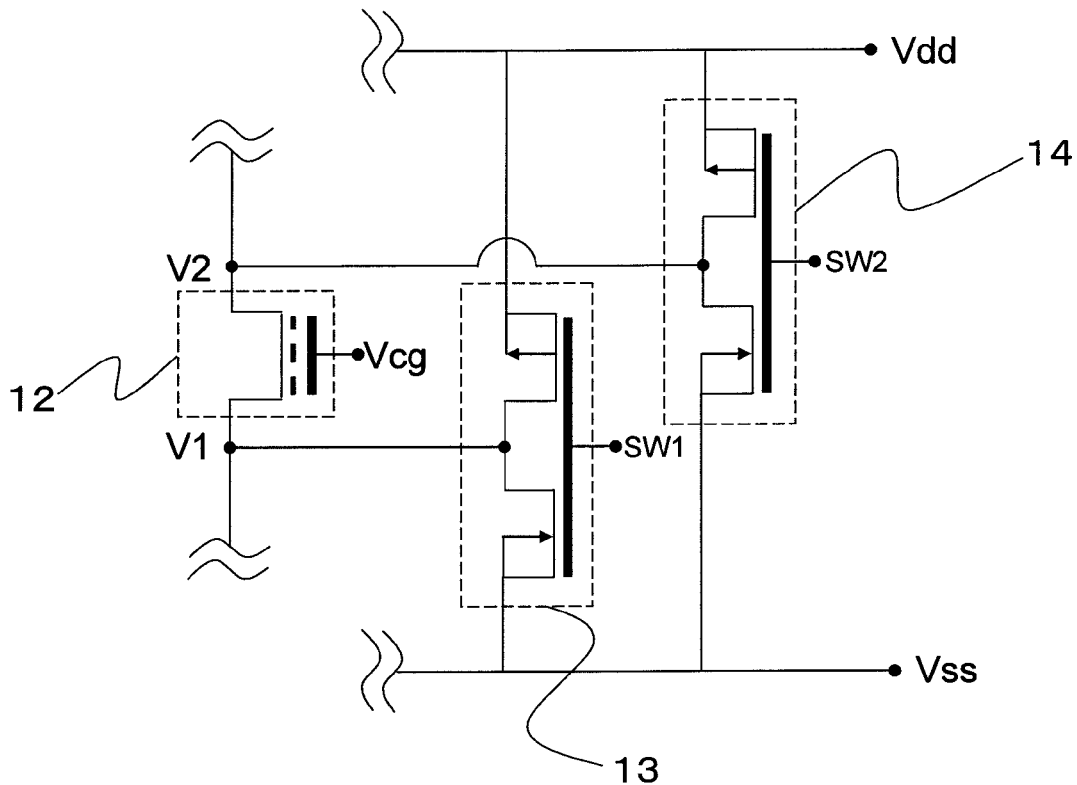
FIG. 2 is a schematic diagram illustrating an outline of a non-volatile memory circuit according to the embodiment of the present invention.
FIG. 3 is a schematic diagram showing a relationship of respective potentials SW1, SW2, V1, and V2.
Figure 4:
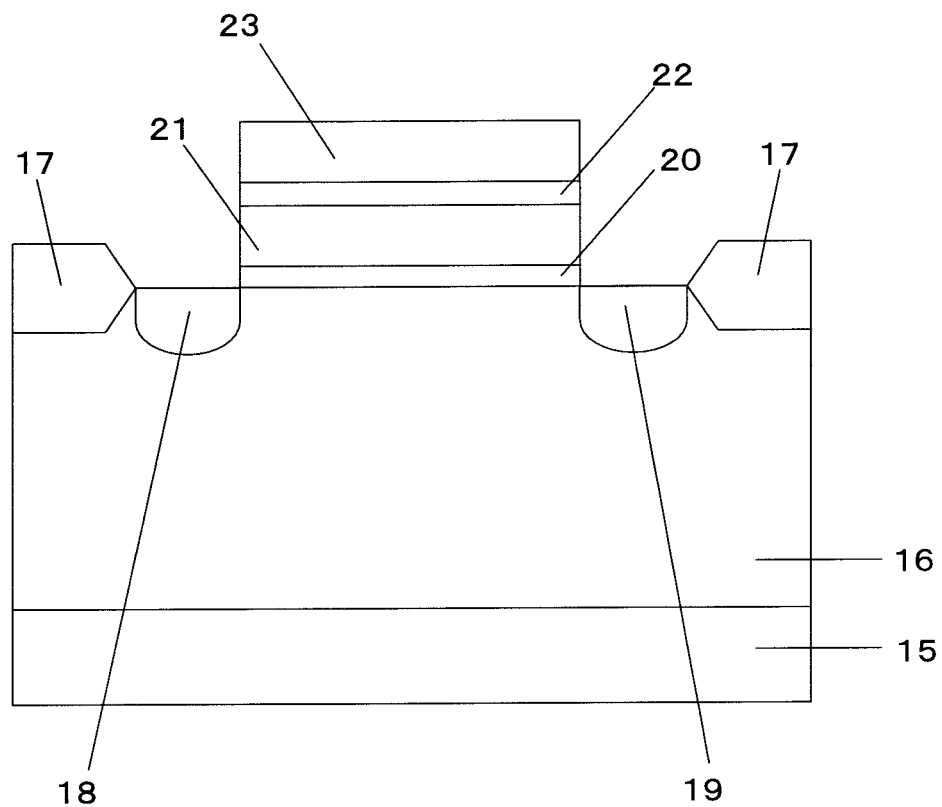
FIG. 4 is a cross-sectional view illustrating the structure of a related-art N-channel non-volatile memory.
Figure 5:
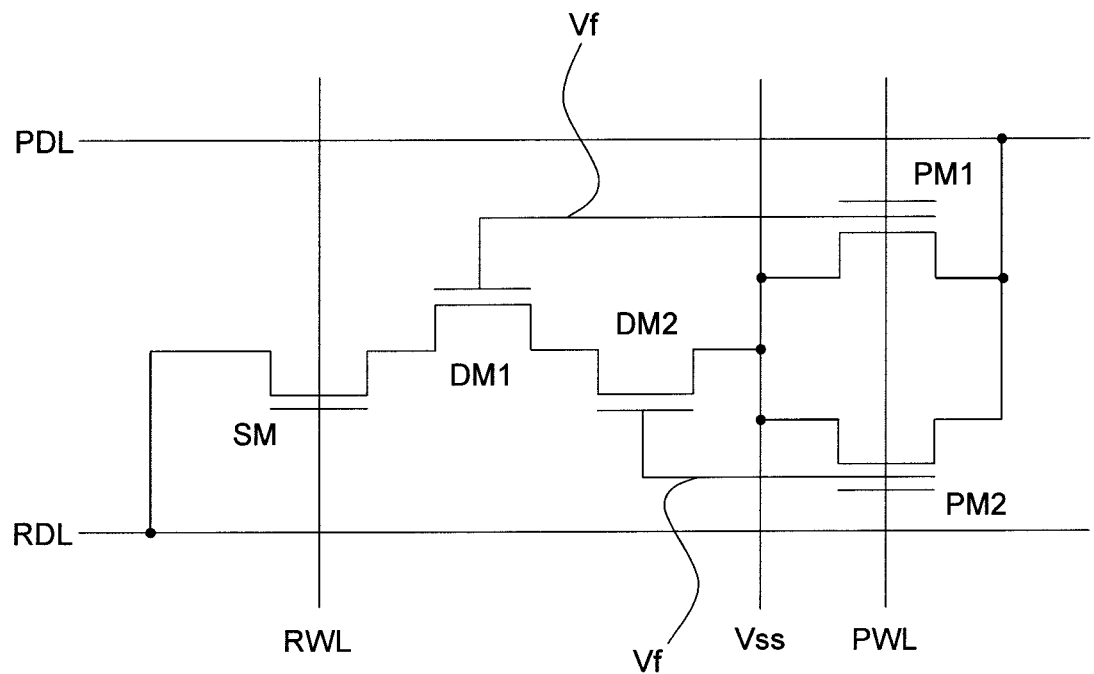
FIG. 5 is a schematic diagram illustrating an outline of the invention described in Japanese Published Patent Application No. 2001-257324.

Next referring to FIG. 2, a non-volatile memory circuit according to this embodiment is described by way of an example where a P-channel non-volatile memory is used. The potential of the first source and drain region 6 is represented by V1, the potential of the second source and drain region 7 is represented by V2, and the potential of the control gate 11 is represented by Vcg. In the non-volatile memory circuit according to this embodiment, a switch circuit 13 is connected in parallel to the first source and drain region 6 of a P-channel non-volatile memory element 12, and a switch circuit 14 is connected in parallel to the second source and drain region 7 thereof. An input potential of the switch circuit 13 is represented by SW1, and an input potential of the switch circuit 14 is represented by SW2. In this example, the switch circuit 13 and the switch circuit 14 are both inverters connected between Vdd and Vss and have the input voltages SW1 and SW2, respectively.

First, a description is given of the operation in writing mode. In writing mode, the input potential SW1 of the switch circuit 13 is controlled to "High" and the input potential SW2 of the switch circuit 14 is controlled to "Low". Then, the first source and drain region 6 on the non-LOCOS offset structure side becomes V1=Vss to serve as the drain, and the second source and drain region 7 on the LOCOS offset structure side becomes V2=Vdd to serve as the source. With this, because the first source and drain region 6 on the non-LOCOS offset side serves as the drain in writing, by appropriately applying the potential Vcg of the control gate 11, hot carriers generated in the vicinity of the drain end are injected, and data is written. According to the P-channel non-volatile memory in this embodiment, the potential Vcg of the control gate 11 can be set between the power supply voltages Vdd and Vss.

Next, in reading mode, the input potential SW1 of the switch circuit 13 is controlled to "Low" and the input potential SW2 of the switch circuit 14 is controlled to "High". Then, the second source and drain region 7 on the LOCOS offset structure side becomes V2=Vss to serve as the drain, and the first source and drain region 6 on the non-LOCOS offset structure side becomes V1=Vdd to serve as the source. With this, because the second source and drain region 7 on the LOCOS offset structure side serves as the drain in reading, the electric field in the vicinity of the drain end is relaxed so that hot carriers responsible for the threshold shift are less likely to be generated. As a result, the threshold shift due to erroneous writing can be reduced.

Next, in a retention mode (a state in which circuit power supply is turned on but writing or reading is not performed), the input potential SW1 of the switch circuit 13 is controlled to "High" and the input potential SW2 of the switch circuit 14 is controlled to "High". Then, the first source and drain region 6 on the non-LOCOS offset structure side becomes V1=Vss, and the second source and drain region 7 on the LOCOS offset structure side becomes V2=Vss. Because the voltages applied to the first source and drain region 6 and the second source and drain region 7 of the P-channel non-volatile memory 12 are equal to each other, a source-drain voltage Vds becomes 0 V. Accordingly, no channel current flows and writing does not occur to prevent erroneous writing.

FIG. 3 shows the relationship of the potentials SW1, SW2, V1, and V2 in the writing mode, the reading mode, and the retention mode described above.

The largest features of this embodiment reside in that the non-volatile memory element having the LOCOS offset structure is used and that the switch circuits connected in parallel to the source and the drain of the non-volatile memory element are controlled to adjust the source and drain potentials in the writing mode, the reading mode, and the retention mode.

Figure 6:
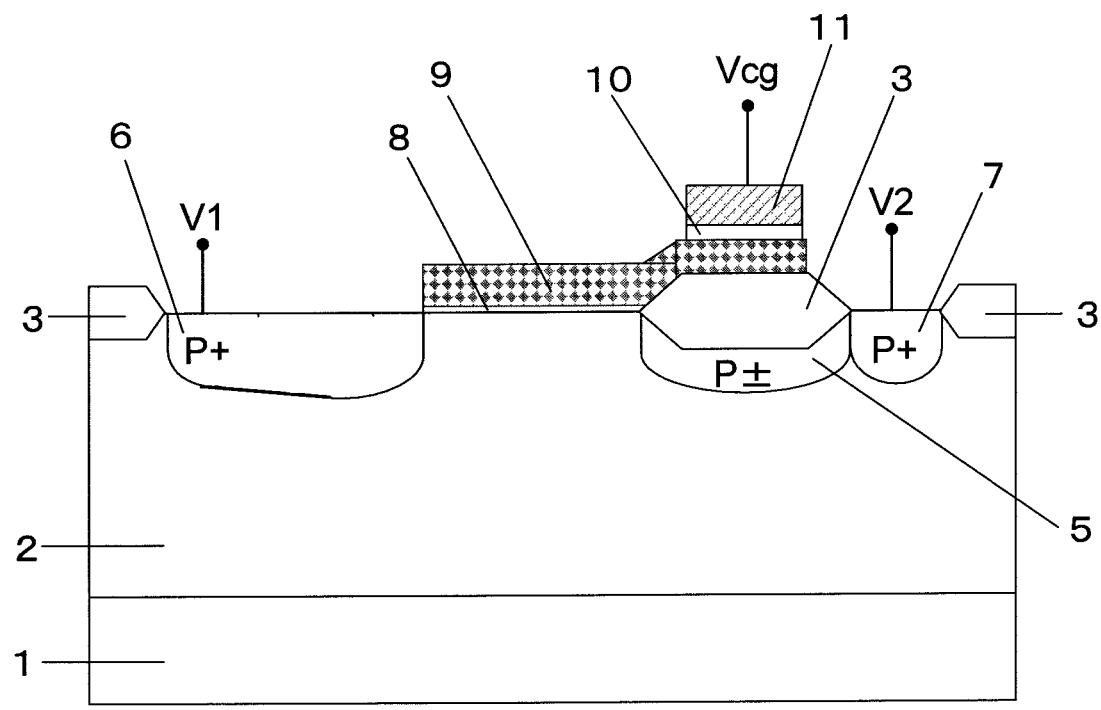
FIG. 6 is a cross-sectional view illustrating the structure of a non-volatile memory used in another embodiment of the present invention.

FIG. 6 is a cross-sectional view illustrating the structure of a non-volatile memory element according to another embodiment of the present invention. The difference from the embodiment illustrated in FIG. 1 resides in that the first lightly doped region 4 is not present between the first source and drain region 6 and the floating gate 9 but the first source and drain region 6 as a P-type heavily doped region extends to immediately below the floating gate 9, which is a so-called conventional structure. With this structure, the first source and drain region 6 as the heavily doped region serves as the drain in writing of the memory, thereby enabling to generate hot carriers effectively.

Although the case where the P-channel non-volatile memory is used has been exemplified in this embodiment, even when an N-channel non-volatile memory is used, similar effects can be obtained by setting the potentials in writing mode and reading mode to have the relationship shown in FIG. 3.

From the embodiments described above, the following effects can be obtained.

According to the present invention, the non-volatile memory transistor having the one-sided LOCOS offset structure is used as the non-volatile memory element, and two pairs of switch circuits connected in parallel to the non-volatile memory element are controlled so that the non-LOCOS offset side serves as the drain in writing and the LOCOS offset side serves as the drain in reading. In the steady state (a state in which power supply is turned on, but the writing or reading is not performed), no potential is applied between the source and the drain of the non-volatile memory element.

With the above-mentioned method, in writing, hot carriers generated in the vicinity of the drain end are injected because the drain side has the non-LOCOS offset structure, thereby obtaining write characteristics equivalent to those of the related-art memory transistor without the LOCOS offset structure. On the other hand, in a reading mode, the electric field in the vicinity of the drain end is relaxed so that hot carriers responsible for the threshold shift are less likely to be generated because the drain has the LOCOS offset structure, thereby being capable of reducing the threshold shift due to erroneous writing. In the retention mode, erroneous writing can be prevented because no potential is applied between the source and the drain of the non-volatile memory element. Consequently, the non-volatile memory circuit capable of preventing erroneous writing while maintaining write efficiency can be provided.

What is claimed is:

1. A non-volatile memory circuit comprising:
    a non-volatile memory having a one-sided LOCOS offset structure, the non-volatile memory comprising:
        a first source and drain region having a non-LOCOS offset structure, which is different from a LOCOS offset structure; and
        a second source and drain region having the LOCOS offset structure;
    switch circuits respectively connected to the first source and drain region and the second source and drain region;
    a floating gate across which the first source and drain region and the second source and drain region are disposed;
    a capacitive coupling oxide film formed on a part of the floating gate;
    a control gate capacitively coupled with the part of the floating gate through intermediation of the capacitive coupling oxide film; and
    a lightly doped region disposed between and in contact with a side of the first source and drain region and an end of the floating gate.

2. A non-volatile memory circuit according to claim 1, wherein the switch circuits comprise inverters.

3. A non-volatile memory circuit comprising:
    a non-volatile memory comprised of a first source and drain region having a non-LOCOS offset structure, and a second source and drain region having a LOCOS offset structure;
    a pair of switch circuits connected in parallel to the first source and drain region and the second source and drain region, respectively, of the non-volatile memory;
    a floating gate across which the first source and drain region and the second source and drain region are disposed;
    a capacitive coupling oxide film formed on a part of the floating gate;
    a control gate capacitively coupled with the part of the floating gate through intermediation of the capacitive coupling oxide film; and
    a lightly doped region disposed between and in contact with a side of the first source and drain region and an end of the floating gate.

4. A non-volatile memory circuit according to claim 3, wherein the switch circuits comprise inverters.

5. A non-volatile memory circuit according to claim 1, wherein the switch circuits are configured to switch voltages applied to the first source and drain region and the second source and drain region; wherein in a writing mode, the first source and drain region serves as a drain; wherein in a reading mode, the second source and drain region serves as the drain; and wherein the switch circuits are controlled so that equal voltages are applied to the first source and drain region and the second source and drain region when power supply is turned on but writing and reading is not performed.

6. A non-volatile memory circuit according to claim 3, wherein the pair of switch circuits are configured to switch voltages applied to the first source and drain region and the second source and drain region so that the first source and drain region serves as a drain and the second source and drain region serves as a source in a writing mode, the second source and drain region serves as a drain and the first source and drain region serves as a source in a reading mode, and equal voltages are applied to the first source and drain region and the second source and drain region in a retention mode in which a power supply of the non-volatile memory circuit is turned on and writing or reading is not performed.

* * * * *